(12) United States Patent
Osada et al.

(10) Patent No.: US 7,955,944 B2
(45) Date of Patent: Jun. 7, 2011

(54) METHOD OF MANUFACTURING SEMICONDUCTOR DEVICE

(75) Inventors: Tatsuro Osada, Kawasaki (JP); Kaoru Saigoh, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 160 days.

(21) Appl. No.: 12/424,123

(22) Filed: Apr. 15, 2009

(65) Prior Publication Data

US 2009/0267185 A1   Oct. 29, 2009

(30) Foreign Application Priority Data

Apr. 23, 2008 (JP) ................................ 2008-112206

(51) Int. Cl.
*H01L 21/20* (2006.01)
(52) U.S. Cl. ................. 438/393; 257/532; 257/E29.343
(58) Field of Classification Search .................. 257/532, 257/534, 535, E29.343; 438/393
See application file for complete search history.

(56) References Cited

U.S. PATENT DOCUMENTS

2005/0082589 A1   4/2005   Noda et al.
2008/0277762 A1*  11/2008  Takewaki et al. ............. 257/532

FOREIGN PATENT DOCUMENTS

JP   2000-357773 A   12/2000
JP   2005-79513 A    3/2005

* cited by examiner

*Primary Examiner* — Thien F Tran
(74) *Attorney, Agent, or Firm* — Westerman, Hattori, Daniels & Adrian, LLP

(57) ABSTRACT

A method of manufacturing a semiconductor device includes forming a wiring layer in a first insulating layer, forming a second insulating layer over the first insulating layer, forming a first conductive layer over the second insulating layer, forming a dielectric layer on the first conductive layer, forming a second conductive layer on the dielectric layer, selectively removing the second conductive layer to form an upper electrode on the dielectric layer, forming a first layer over the upper electrode and the dielectric layer, selectively removing the first layer, the dielectric layer, and the first conductive layer to form a lower electrode over which the dielectric layer and the first layer is entirely left, the upper electrode remaining partially over the lower electrode.

5 Claims, 11 Drawing Sheets

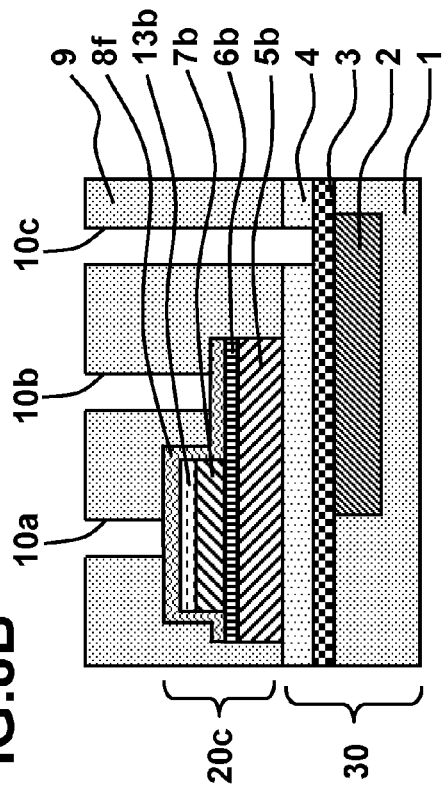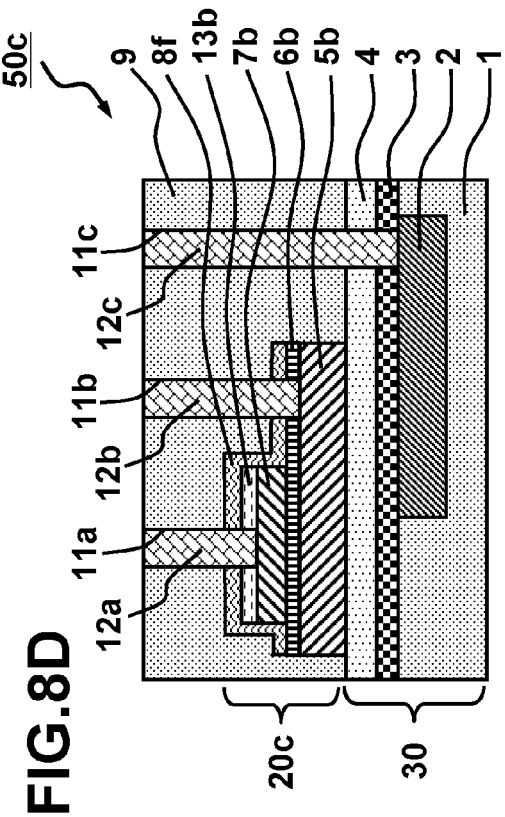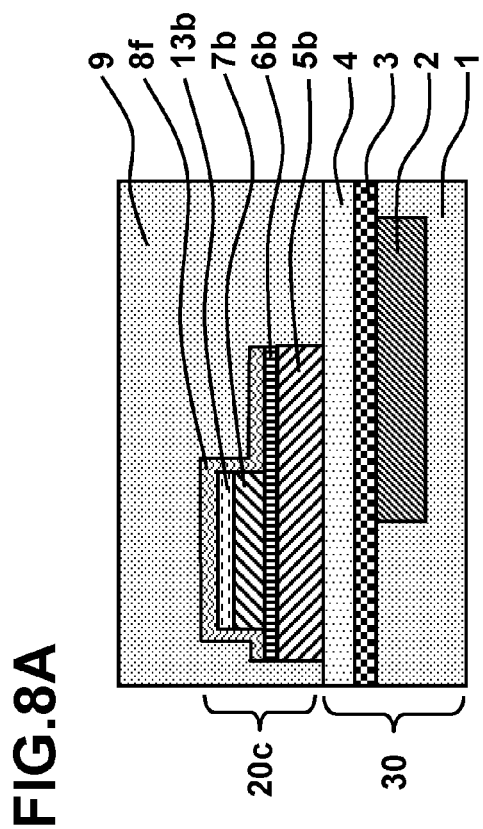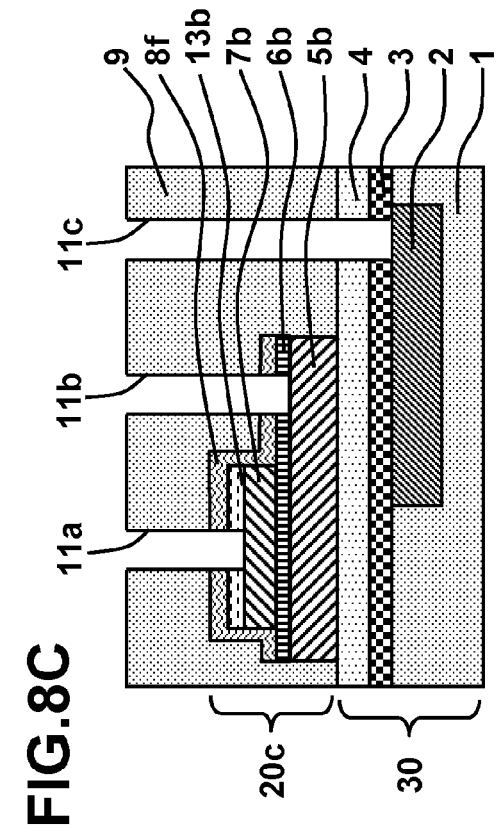
FIG.8A
FIG.8B
FIG.8C
FIG.8D

//  METHOD OF MANUFACTURING
SEMICONDUCTOR DEVICE

CROSS-REFERENCE TO RELATED APPLICATION

This application is based upon and claims the benefit of priority of the prior Japanese Patent Application No. 2008-112206 filed on Apr. 23, 2008, the entire contents of which are incorporated herein by reference.

FIELD

An aspect of the embodiments discussed herein is directed to a method of manufacturing the semiconductor device including a capacitive element.

BACKGROUND

As a mobile communication medium such as a cell phone becomes sophisticated in performance and is miniaturized, high capacity and high performance level are required of an electrostatic capacity element used in a semiconductor integrated circuit for communication use. Such an electrostatic capacity element includes a lower electrode as a first conductive layer, an upper electrode as a second conductive layer, and a dielectric layer sandwiched between the lower electrode and the upper electrode. From among the elements, a metal-insulator-metal (MIM) capacitive element having metal electrodes, in particular, has a low parasitic capacitance and a low parasitic resistance and may achieve high performance.

Japanese Laid-open Patent Publication No. 2005-79513 discusses a technique of a semiconductor device including an MIM capacitive element that includes a lower electrode, an upper electrode having an area larger than an area of the upper electrode, and a dielectric layer. In accordance with the disclosure, an insulating layer is deposited on a top surface and a side wall of the upper electrode to maintain insulation on the dielectric layer.

Opening operations of opening via holes in the upper electrode and the lower electrode of the MIM capacitive element in the semiconductor device are performed separately. Since the opening operation needs a plurality of mask formation operations, a manufacturing process has an increased number of operations. To decrease manufacturing operations, the opening operations are preferably performed on the upper electrode and the lower electrode at the same operation. If such an opening operation is performed, the upper electrode may be overetched because of a difference in thickness of the electrodes, and the dielectric layer may be damaged.

SUMMARY

According to an aspect of an embodiment, a method of manufacturing a semiconductor device includes forming a wiring layer in a first insulating layer, forming a second insulating layer over the first insulating layer, forming a first conductive layer over the second insulating layer, forming a dielectric layer on the first conductive layer, forming a second conductive layer on the dielectric layer, selectively removing the second conductive layer to form an upper electrode on the dielectric layer, forming a first layer over the upper electrode and the dielectric layer, selectively removing the first layer, the dielectric layer, and the first conductive layer to form a lower electrode over which the dielectric layer and the first layer is entirely left, the upper electrode remaining partially over the lower electrode, forming a third insulating layer over the second insulating layer and the first layer, the third insulating layer having the etching resistance property smaller than the etching resistance property of the second insulating layer and the first layer against an etchant for etching the third insulating layer, selectively removing the third insulating layer to form a first aperture exposing the second insulating layer above the wiring layer, a second aperture exposing the first layer above the upper electrode, and a third aperture exposing the first layer above the dielectric layer, and performing an etching operation to expose the wiring layer below the first aperture, the upper electrode below the second aperture, and the lower electrode below the third aperture.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 8A-8D are cross-sectional views each illustrating the method of manufacturing the semiconductor device 50c according to the third embodiment;

DESCRIPTION OF EMBODIMENTS

A first embodiment, a second embodiment, a third embodiment and a fourth embodiment are described below. The present technique is not limited to these embodiments.

FIGS. 1A-1D and FIGS. 2A-2D illustrate in detail a structure and a manufacturing method of a semiconductor device 50a including a metal-insulator-metal (MIM) capacitive element 20a in accordance with a first embodiment.

In the semiconductor device 50a of the first embodiment, a lower electrode 5b in the MIM capacitive element 20a may be made of a material different from a material of a wiring layer 2. Since the lower electrode 5b and the wiring layer 2 are present at different depths in the semiconductor device 50a, the wiring layer 2 may be formed right below the MIM capacitive element 20a. A high degree of design freedom is provided in the design of the semiconductor device 50a.

Figure 2A:
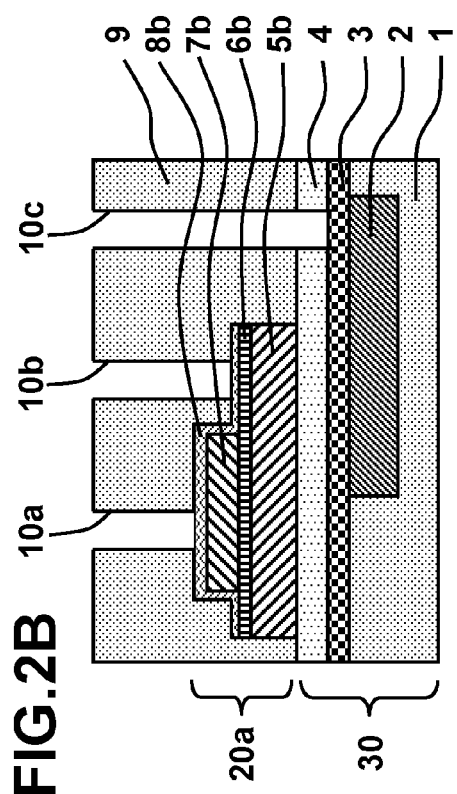
FIGS. 2A-2D are cross-sectional views each illustrating the method of manufacturing the semiconductor device 50a according to the first embodiment.
Figure 2B:
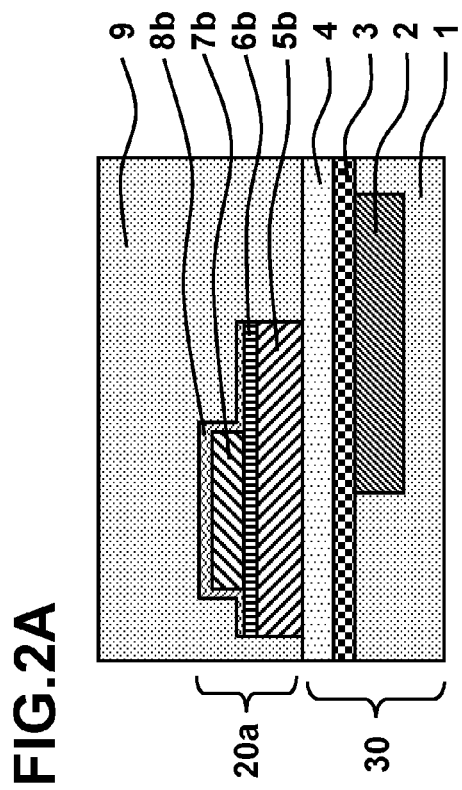
Figure 2C:
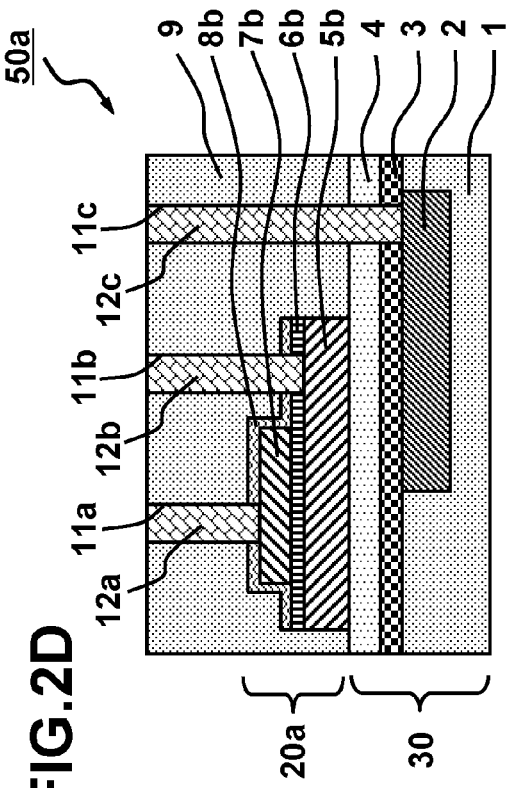
Figure 2D:
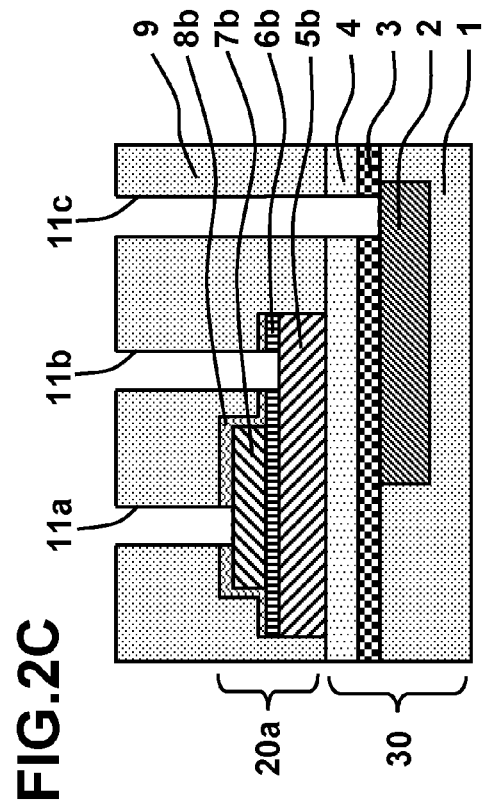

Referring to FIG. 2D, the structure of the semiconductor device 50a of the first embodiment is described below.

The semiconductor device 50a includes the MIM capacitive element 20a above a substrate 30. An interlayer insulator 9 is formed to cover the substrate 30 and the MIM capacitive element 20a.

The substrate 30 includes a lower interlayer insulator 1, the wiring layer 2, a diffusion preventing layer 3, and a silicon dioxide ($SiO_2$) layer 4. The lower interlayer insulator 1 is made of silicon dioxide ($SiO_2$). The wiring layer 2 is formed in the lower interlayer insulator 1. The diffusion preventing layer 3 is formed over the lower interlayer insulator 1 and the wiring layer 2. The silicon dioxide layer 4 is formed on the diffusion preventing layer 3.

The MIM capacitive element 20a includes an upper electrode 7b, a dielectric layer 6b, and the lower electrode 5b. The lower electrode 5b and the dielectric layer 6b extend over the upper electrode 7b. It is noted that a first etching stopper 8b is formed, covering the upper electrode 7b and the dielectric layer 6b.

A via hole 11a is opened in the interlayer insulator 9 and the first etching stopper 8b to establish electrical connection with the upper electrode 7b in the MIM capacitive element 20a. A via hole 11b is opened in the interlayer insulator 9, the first etching stopper 8b, and the dielectric layer 6b to establish electrical connection with the lower electrode 5b in the MIM capacitive element 20a. A via hole 11c is opened in the interlayer insulator 9, the silicon dioxide layer 4, and the diffusion preventing layer 3 to establish electrical connection with the wiring layer 2 of the substrate 30. A via wiring 12a is formed by filling the via hole 11a with a conductor into. A via wiring 12b is formed by filling the via hole 11b with a conductor. A via wiring 12c is formed by filling the via hole 11c with a conductor. The wiring layer 2 extends below the MIM capacitive element 20a. The upper electrode 7b, the lower electrode 5b, and the wiring layer 2 are formed at different depths of the semiconductor device 50a. The via wiring 12a and the via hole 11a are collectively referred to as a first contact via, the via wiring 12b and the via hole 11b are collectively referred to as a second contact via, and the via wiring 12c and the via hole 11c are collectively referred to as a third contact via.

A method of manufacturing the semiconductor device 50a of the first embodiment is described below with reference to FIGS. 1A-1D and FIGS. 2A-2D.

Figure 1A:
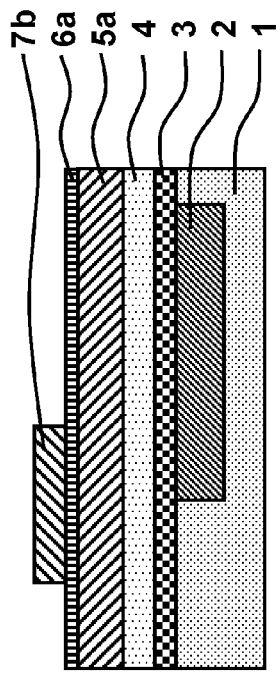
FIGS. 1A-1D are cross-sectional views each illustrating a method of manufacturing a semiconductor device 50a according to a first embodiment.

Referring to FIG. 1A, the diffusion preventing layer 3 made of silicon carbide (SiC) and having a thickness of, for example, about 70 nm is deposited over the wiring layer 2 in the lower interlayer insulator 1 through a sputtering process. The wiring layer 2 is made of copper, for example. The silicon dioxide layer 4 having a thickness of, for example, about 100 nm is deposited on the diffusion preventing layer 3 through a sputtering process. A first conductive layer 5a made of titanium nitride (TiN) and having a thickness of, for example, about 150 nm is then deposited on the silicon dioxide layer 4 through a sputtering process. A dielectric layer 6a made of silicon dioxide ($SiO_2$) and having a thickness of, for example, about 40 nm is deposited on the first conductive layer 5a through a chemical vapor deposition (CVD) process. A second dielectric layer 7a made of titanium nitride and having a thickness of, for example, about 100 nm is deposited on the dielectric layer 6a through a sputtering process.

Figure 1B:
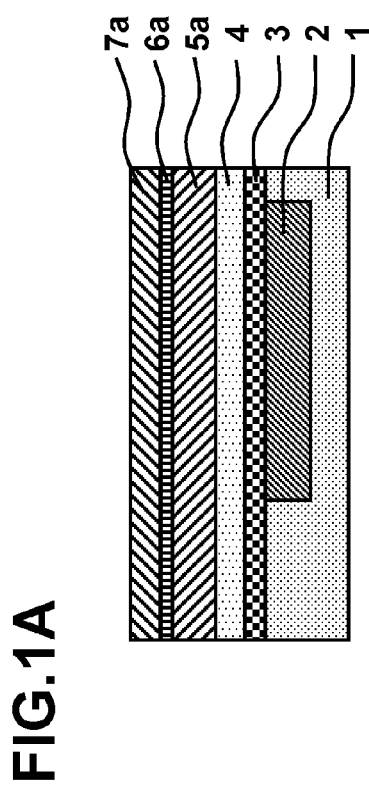

Referring to FIG. 1B, the second conductive layer 7a is patterned through a lithographic process and an etching process to form the upper electrode 7b. In this process, the first conductive layer 5a and the dielectric layer 6a extend over the upper electrode 7b.

Figure 1C:
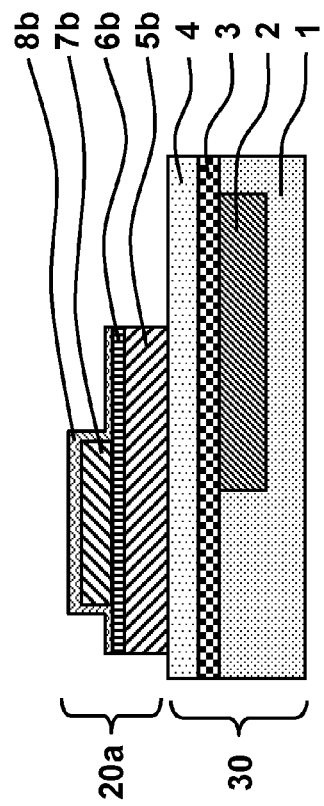

With reference to FIG. 1C, a first etching stopper 8a is formed to a thickness of 70 nm through a CVD process to cover the upper electrode 7b and the dielectric layer 6a.

Figure 1D:
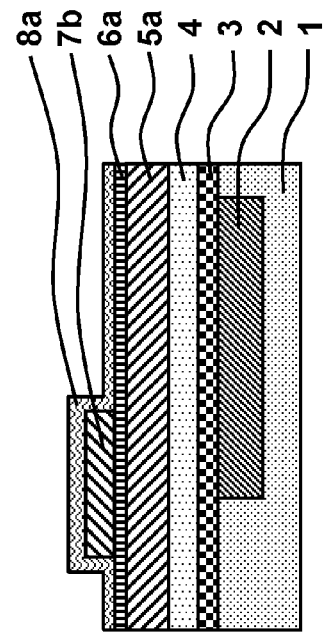

With reference to FIG. 1D, the first etching stopper 8a and the dielectric layer 6a are treated by a lithographic process and an etching process to form the lower electrode 5b.

With reference to FIG. 2A, a plasma $SiO_2$ layer is formed to a thickness of, for example, about 650 nm as the interlayer insulator 9 using a silane gas to cover the silicon dioxide layer 4, the lower electrode 5b, the dielectric layer 6b, and the first etching stopper 8b. The interlayer insulator 9 is formed, for example, using one of silane gases ($SiH_2Cl_2$, $SiH_4$, $Si_2H_4$, $Si_2H_6$, etc) through, for example, a CVD process.

Referring to FIG. 2B, a via hole 10a, a via hole 10b, and a via hole 10c are opened in the interlayer insulator 9 toward the upper electrode 7b, the lower electrode 5b, and the wiring layer 2, respectively, at the same operation through a lithographic process and an etching process. The interlayer insulator 9 and the silicon dioxide layer 4 are etched, for example, using $C_4F_6/Ar/O_2$ gases containing fluorine based $C_4F_6$ gas through a reactive ion etching (RIE) process. A chamber temperature is, for example, room temperature, and the gas flow rates are, for example, 10-30 sccm for the $C_4F_6$ gas, 100-300 sccm for the Ar gas, and 5-15 sccm for the $O_2$ gas.

Gas flow rates and pressure conditions are adjusted so that the interlayer insulator 9 has an etching rate higher than that of each of the first etching stopper 8b, the dielectric layer 6b, and the diffusion preventing layer 3. More specifically, gas flow rates and pressure conditions are adjusted so that each of the first etching stopper 8b, the dielectric layer 6b, and the diffusion preventing layer 3 has an etching rate equal to or lower than 0.1 times the etching rate of the interlayer insulator 9, under the same etching condition as the etching condition applied to the interlayer insulator 9. Such an adjustment prevents the upper electrode 7b and the lower electrode 5b from being overetched.

Referring to FIG. 2C, the first etching stopper 8b, the dielectric layer 6b, and the diffusion preventing layer 3 respectively present at the bottoms of the via hole 10a, the via hole 10b, and the via hole 10c are removed. These layers are etched using, for example, $CH_2F_2/N_2/O_2$ gases containing a fluorine based $CH_2F_2$ gas through the RIE process. In this etching process, the chamber temperature is room temperature, and gas flow rates are, for example, 10-35 sccm for the $CH_2F_2$ gas, 50-100 sccm for the $N_2$ gas, and 15-40 sccm for the $O_2$ gas. The via hole 11a, the via hole 11b, and the via hole 11c are thus opened.

Referring to FIG. 2D, tungsten (W) fills the via hole 11a, the via hole 11b, and the via hole 11c through a CVD process to form the via wiring 12a, the via wiring 12b, and the via wiring 12c. A barrier metal formation operation is not illustrated. The semiconductor device 50a including the MIM capacitive element 20a is thus produced.

With the semiconductor device 50a including the MIM capacitive element 20a manufactured as described above, the lower electrode 5b is made of a material different from a material of the wiring layer 2. The via holes are opened to the upper electrode 7b, the lower electrode 5b, and the wiring layer 2 at the same process operation. Since the first etching stopper 8b covers the entire the MIM capacitive element, each electrode may be protected from overetching and free from contact failure. Since the lower electrode 5b and the wiring layer 2 are deposited at different depths, a wiring may be formed right below the MIM capacitive element 20a. The design freedom of the semiconductor device 50a may be increased.

A second embodiment is described below with reference to FIGS. 3A-3C through FIGS. 5A-5C. FIGS. 3A-3C through FIGS. 5A-5C illustrate in detail a structure of a semiconductor device 50b having an MIM capacitive element 20b in accordance with the second embodiment. Elements identical to those described in connection with the first embodiment are designated with the same reference numerals and the discussions thereof are omitted here.

The semiconductor device 50b of the second embodiment includes a first etching stopper 8d and the dielectric layer 6b, both made of silicon nitride (SiN). With this structure, a groove defect generated in a dielectric layer 6c present beneath the upper electrode 7b in the course of a patterning process of the upper electrode 7b is filled with the first etching stopper 8d that is made of the same material as the dielectric layer 6c. More specifically, the defect of the dielectric layer 6c is corrected. This arrangement may control a reduction in withstanding voltage of the MIM capacitive element 20b and lot-to-lot manufacturing variations in a capacitance of the MIM capacitive element 20b.

A structure of the semiconductor device 50b of the second embodiment is described below with reference to FIG. 5C.

The semiconductor device 50b includes the MIM capacitive element 20b on the substrate 30. The interlayer insulator 9 is formed, covering the substrate 30 and the MIM capacitive element 20b.

The MIM capacitive element 20b includes the upper electrode 7b, a dielectric layer 6d, and the lower electrode 5b. The lower electrode 5b and the dielectric layer 6d extend over the upper electrode 7b. The first etching stopper 8d is formed, covering the upper electrode 7b and the dielectric layer 6d.

The via hole 11a is opened in the interlayer insulator 9 and the first etching stopper 8d to establish electrical connection with the upper electrode 7b of the MIM capacitive element 20b. The via hole 11b is opened in the interlayer insulator 9, the first etching stopper 8d, and the dielectric layer 6d to establish electrical connection with the lower electrode 5b of the MIM capacitive element 20b. The via hole 11c is opened in the interlayer insulator 9, the silicon dioxide layer 4, and the diffusion preventing layer 3 to establish electrical connection with the wiring layer 2 of the substrate 30. The via wiring 12a is formed by filling the via hole 11a with a conductor. The via wiring 12b is formed by filling the via hole 11b with a conductor. The via wiring 12c is formed by filling the via hole 11c with a conductor. The wiring layer 2 extends below the MIM capacitive element 20b. The upper electrode 7b, the lower electrode 5b, and the wiring layer 2 are formed at different depths of the semiconductor device 50b. The via wiring 12a and the via hole 11a, the via wiring 12b and the via hole 11b, and the via wiring 12c and the via hole 11c are respectively collectively referred to as a contact via.

A method of manufacturing the semiconductor device 50b of the second embodiment is described below with reference to FIGS. 3A-3C through FIGS. 5A-5C.

Figure 3A:
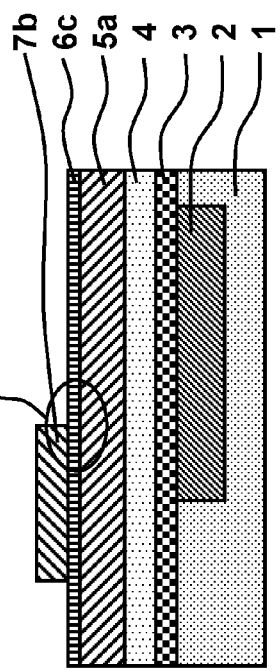
FIGS. 3A-3C are cross-sectional views each illustrating a method of manufacturing a semiconductor device 50b according to a second embodiment.

Referring to FIG. 3A, the diffusion preventing layer 3 is deposited over the wiring layer 2 in the lower interlayer insulator 1 in the same manner as previously described with reference to FIG. 1A. The silicon dioxide layer 4 is deposited on the diffusion preventing layer 3 in the same manner as previously described with reference to FIG. 1A. The first conductive layer 5a is then deposited on the silicon dioxide layer 4 in the same manner as previously described with reference to FIG. 1A. The dielectric layer 6c made of silicon nitride (SiN) and having a thickness of, for example, about 40 nm is deposited on the first conductive layer 5a through a CVD process. The second conductive layer 7a made of titanium nitride and having a thickness of, for example, about 100 nm is deposited on the dielectric layer 6c through a sputtering process, for example.

Figure 3B:
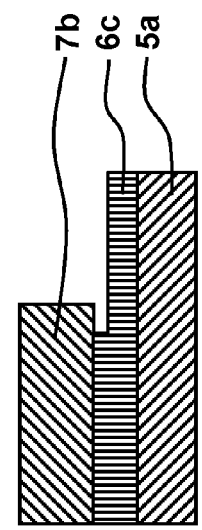

Referring to FIG. 3B, the second conductive layer 7a is patterned through a lithographic process and an etching process to form the upper electrode 7b. In this process, the first conductive layer 5a and the dielectric layer 6a are formed to extend over the upper electrode 7b.

Figure 3C:
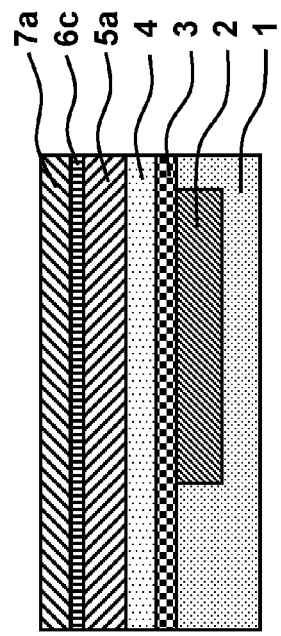

FIG. 3C is an expanded view of a contact portion denoted by the letter A between the underside of the upper electrode 7b and the dielectric layer 6c in FIG. 3B. FIG. 3C illustrates a groove defect that is generated in a dielectric layer 6c present beneath the upper electrode 7b in the course of the patterning process of the second conductive layer 7a. Such a groove defect may cause a reduction in the withstanding voltage of the MIM capacitive element 20b and lot-to-lot variations in the capacitance of the MIM capacitive element 20b.

Figure 4A:
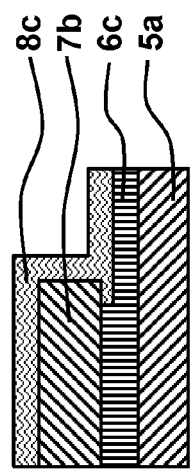
FIGS. 4A-4D are cross-sectional views each illustrating the method of manufacturing the semiconductor device 50b according to the second embodiment.
Figure 4B:
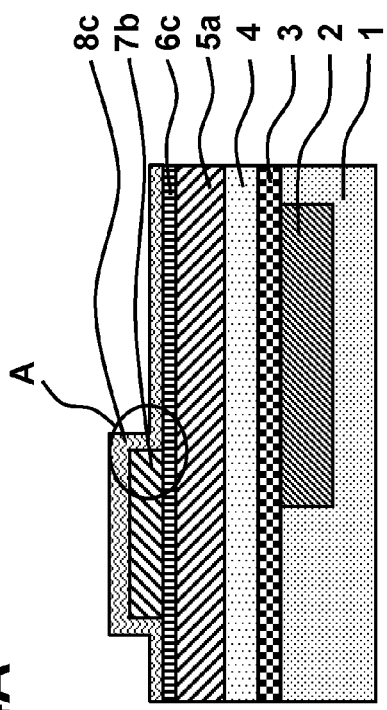

With reference to FIG. 4A, a first etching stopper 8c is formed to a thickness of, for example, about 70 nm through a CVD process to cover the upper electrode 7b and the dielectric layer 6c. FIG. 4B is an expanded view of a contact portion denoted by the letter A between the underside of the upper electrode 7b and the dielectric layer 6c in FIG. 4A. As illustrated in FIG. 4B, the first etching stopper 8c made of the same material of the dielectric layer 6c may fill a groove defect that has been generated in the dielectric layer 6c present beneath the upper electrode 7b in the course of the patterning process of the upper electrode 7b. The defect of the dielectric layer 6c is thus corrected. This arrangement may control a reduction in the withstanding voltage of the MIM capacitive element 20b and lot-to-lot variations in the capacitance of the MIM capacitive element 20b.

Figure 4C:
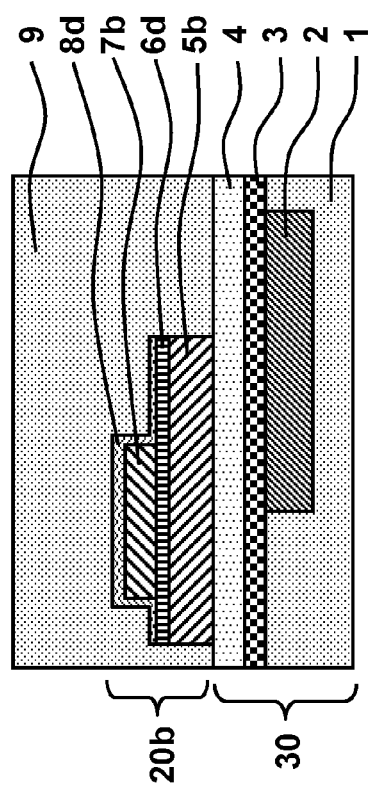

With reference to FIG. 4C, the first etching stopper 8d, the dielectric layer 6c, and the first conductive layer 5a are treated by a lithographic process and an etching process. Through this process, the first etching stopper 8d, the dielectric layer 6d, and the lower electrode 5b are formed. The MIM capacitive element 20b, including the upper electrode 7b, the dielectric layer 6d, and the lower electrode 5b, is thus formed.

Figure 4D:
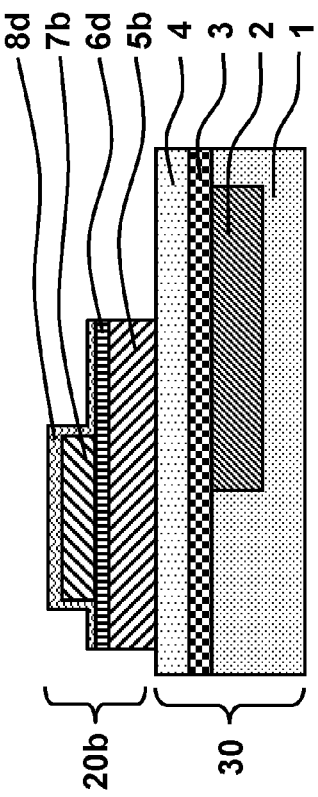

With reference to FIG. 4D, a $SiO_2$ layer is formed to a thickness of, for example, about 650 nm as the interlayer insulator 9 using a silane gas to cover the silicon dioxide layer 4, the lower electrode 5b, the dielectric layer 6d, and the first etching stopper 8d in the same manner as described with reference to FIG. 2A.

Figure 5A:
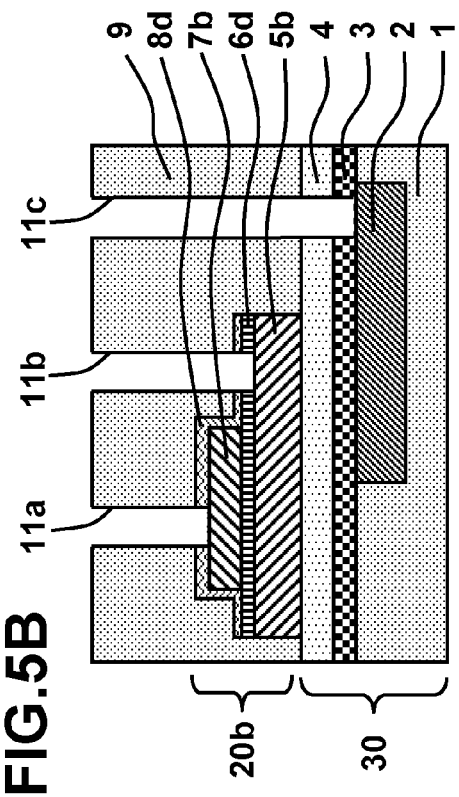
FIGS. 5A-5C are cross-sectional views each illustrating the method of manufacturing the semiconductor device 50b according to the second embodiment.

Referring to FIG. 5A, a via hole 10a, a via hole 10b, and a via hole 10c are opened in the interlayer insulator 9 and the silicon dioxide layer 4 toward the upper electrode 7b, the lower electrode 5b, and the wiring layer 2, respectively, at the same operation through a lithographic process and an etching process. The interlayer insulator 9 and the silicon dioxide layer 4 are etched, for example, using $C_4F_6/Ar/O_2$ gases containing a fluorine based $C_4F_6$ gas through an RIE process. A chamber temperature is, for example, room temperature, and the gas flow rates are, for example, 10-30 sccm for the $C_4F_6$ gas, 100-300 sccm for the Ar gas, and 5-15 sccm for the $O_2$ gas.

Gas flow rates and pressure conditions are adjusted so that the interlayer insulator 9 has an etching rate higher than that of each of the first etching stopper 8d, the dielectric layer 6d, and the diffusion preventing layer 3. More specifically, gas flow rates and pressure conditions are adjusted so that each of the first etching stopper 8d, the dielectric layer 6d, and the diffusion preventing layer 3 may have an etching rate equal to or lower than 0.1 times the etching rate of the interlayer insulator 9, under the same etching condition as the etching condition applied to the interlayer insulator 9. Such an etching condition may prevent the upper electrode 7b and the lower electrode 5b from being overetched.

Figure 5B:
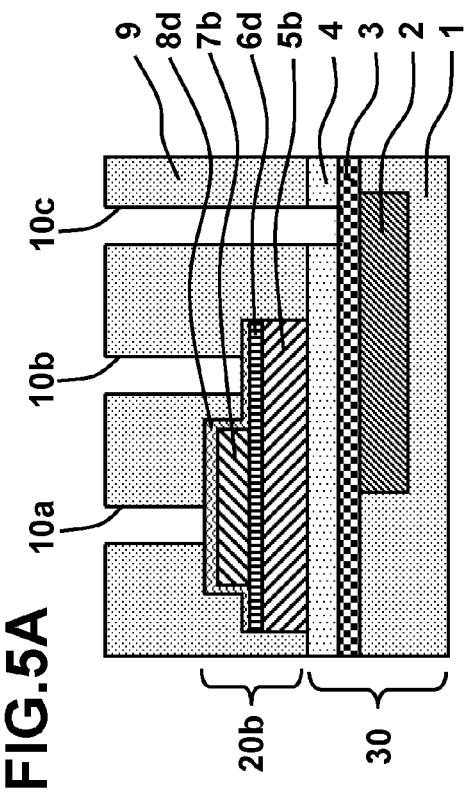

Referring to FIG. 5B, the first etching stopper 8d, the dielectric layer 6d, and the diffusion preventing layer 3 respectively present at the bottoms of the via hole 10a, the via hole 10b, and the via hole 10c are removed. These layers are etched using, for example, $CH_2F_2/N_2/O_2$ gases containing a fluorine based $CH_2F_2$ gas through the RIE process. In this etching process, the chamber temperature is, for example, room temperature, and gas flow rates are, for example, 10-35 sccm for the $CH_2F_2$ gas, 50-100 sccm for the $N_2$ gas, and 15-40 sccm for the $O_2$ gas. The via hole 11a, the via hole 11b, and the via hole 11c are thus produced.

Figure 5C:
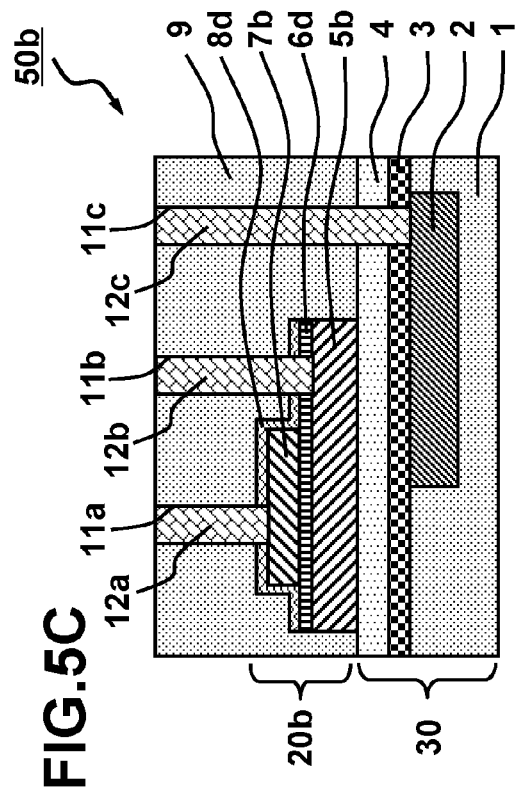

Referring to FIG. 5C, for example, tungsten (W) placed to fill the via hole 11a, the via hole 11b, and the via hole 11c through a CVD process to form the via wiring 12a, the via wiring 12b, and the via wiring 12c in the same manner as previously described with reference to FIG. 2D. A barrier metal formation operation is not illustrated. The semiconductor device 50b including the MIM capacitive element 20b is thus produced.

Figure 6:
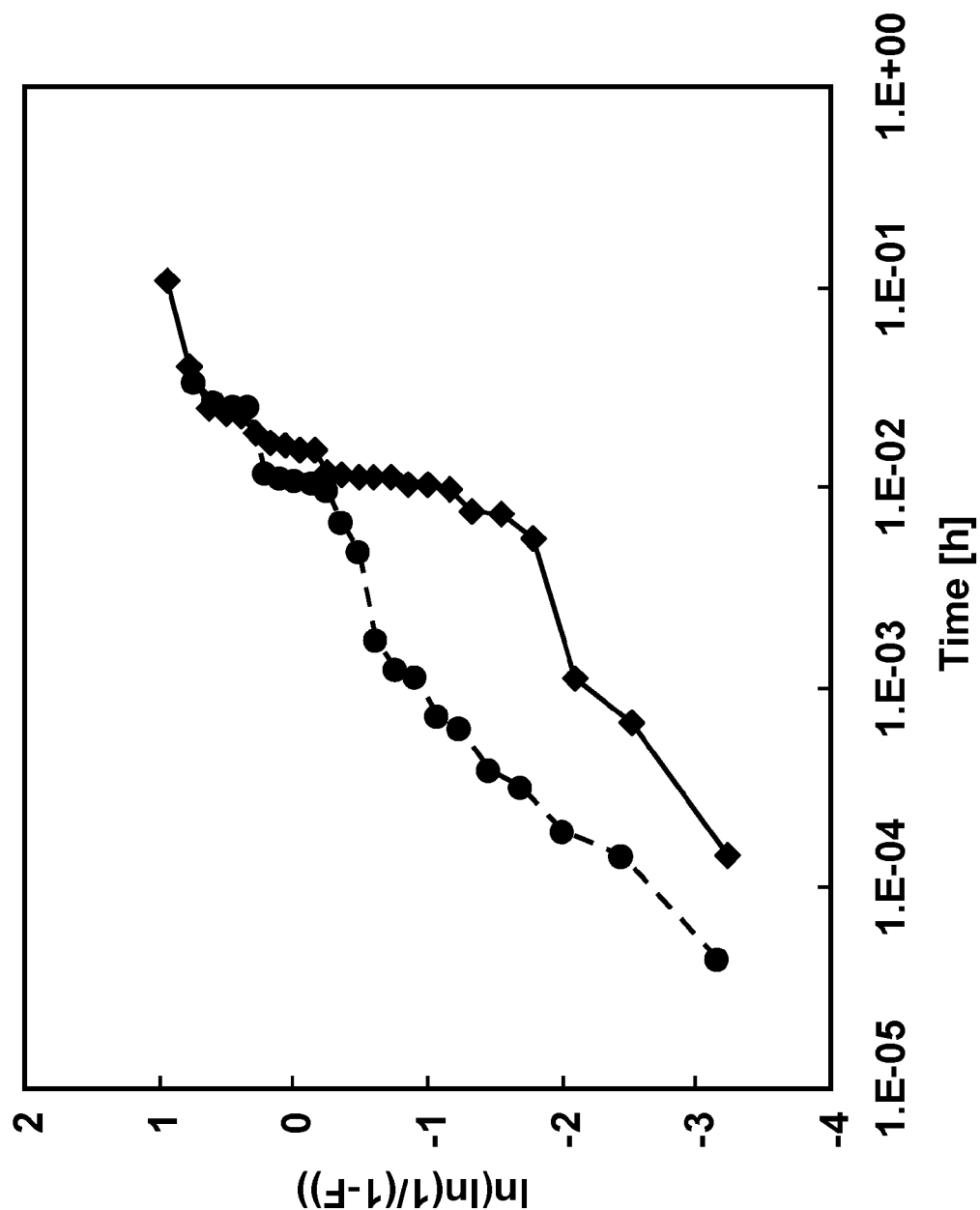
FIG. 6 is a Weibull plot relating to dielectric breakdown of the MIM capacitive element 20b of the semiconductor device 50b.

FIG. 6 illustrates a Weibull plot relating to dielectric breakdown of the MIM capacitive element 20b of the semiconductor device 50b. The Weibull plot of FIG. 6 illustrates a distribution of cumulative probability of the dielectric breakdown of the MIM capacitive element 20b of the semiconductor device 50b. In FIG. 6, the ordinate represents the cumulative probability of the dielectric breakdown of the dielectric layer 6d in the MIM capacitive element 20b, and the abscissa represents time (h) to the dielectric breakdown of the dielectric layer 6d in the MIM capacitive element 20b. The data plot denoted by a broken line represents the distribution of the cumulative probability of dielectric breakdowns and time to the dielectric breakdowns of the MIM capacitive element with a voltage as high as 20 V applied between the upper electrode and the lower electrode in the semiconductor device. In this case, the semiconductor device has no first etching stopper formed on the side wall of the upper electrode. The data plot denoted by a solid line represents the distribution of the cumulative probability of dielectric breakdown and time to the dielectric breakdown of the MIM capacitive element 20b with a voltage as high as 20 V applied between the upper electrode 7b and the lower electrode 5b in the semiconductor device 50b. In this case, the semiconductor device 50b has the first etching stopper 8d formed on the side wall of the upper electrode 7b.

Referring to FIG. 6, the rate of dielectric breakdown increases with time in the semiconductor device having the MIM capacitive element with no first etching stopper formed on the side wall of the upper electrode. In accordance with the second embodiment, the semiconductor device 50b having the MIM capacitive element 20b with the first etching stopper 8d formed on the side wall of the upper electrode 7b provides the data plot indicating the cumulative probability of block diagram generally shifted to longer life side. The gradient of the data plot sharply increases at $0.5 \times 10^{-2}$ (h) and later. The first etching stopper 8d formed on the side wall of the upper electrode 7b may thus control a reduction in the withstanding voltage of the MIM capacitive element 20b and lot-to-lot manufacturing variations in the capacitance of the MIM capacitive element 20b.

The first etching stopper 8d and the dielectric layer 6d are made of silicon nitride (SiN) in the semiconductor device 50b having the MIM capacitive element 20b in accordance with the second embodiment. With this structure, the groove defect generated in the dielectric layer 6c present beneath the upper electrode 7b in the course of the patterning process of the upper electrode 7b is filled with the first etching stopper 8d that is made of the same material as the dielectric layer 6c. More specifically, the defect of the dielectric layer 6c may be corrected. This arrangement may control a reduction in the withstanding voltage of the MIM capacitive element 20b and lot-to-lot manufacturing variations in the capacitance of the MIM capacitive element 20b.

A third embodiment is described below with reference to FIGS. 7A-7D and FIG. 8A-8D. FIGS. 7A-7D and FIG. 8A-8D illustrate in detail a structure of a semiconductor device 50c having an MIM capacitive element 20c in accordance with the third embodiment. In the discussion of the third embodiment, elements identical to those described in connection with the first and second embodiments are designated with the same reference numerals and the discussion thereof are omitted here.

The semiconductor device 50c of the third embodiment includes a second etching stopper 13b and the dielectric layer 6b. With this structure, the second etching stopper 13b formed on the upper electrode 7b, a first etching stopper 8f formed on the lower electrode 5b, and the diffusion preventing layer 3 formed on the wiring layer 2 are removed at the same operation of removing each etching stopper remaining at the bottom of each via. The upper electrode 7b, the lower electrode 5b, and the wiring layer 2 may thus be prevented from being overetched. A good contact may thus be established when each of the via hole 11a, the via hole 11b, and the via hole 11c is filled with the metal. The wiring layer 2 is arranged below the MIM capacitive element 20c. The upper electrode 7b, the lower electrode 5b and the wiring layer 2 are formed at different depths.

A structure of the semiconductor device 50c of the third embodiment is described below with reference to FIG. 8D.

The semiconductor device 50c includes the MIM capacitive element 20c on the substrate 30. The interlayer insulator 9 is formed, covering the substrate 30 and the MIM capacitive element 20c.

The MIM capacitive element 20c includes the upper electrode 7b, the dielectric layer 6b, and the lower electrode 5b. The lower electrode 5b and the dielectric layer 6b are formed to extend over the upper electrode 7b. The first etching stopper 8f is formed, covering the upper electrode 7b and the dielectric layer 6b. The second etching stopper 13b is formed on the upper electrode 7b.

The via hole 11a is opened in the interlayer insulator 9 and the first etching stopper 8f to establish electrical connection with the upper electrode 7b of the MIM capacitive element 20c. The via hole 11b is opened in the interlayer insulator 9, the first etching stopper 8f, and the dielectric layer 6b to establish electrical connection with the lower electrode 5b of the MIM capacitive element 20c. The via hole 11c is opened in the interlayer insulator 9, the silicon dioxide layer 4, and the diffusion preventing layer 3 to establish electrical connection with the wiring layer 2 of the substrate 30. The via wiring 12a is formed by filling the via hole 11a with a conductor. The via wiring 12b is formed by filling the via hole 11b with a conductor. The via wiring 12c is formed by filling the via hole 11c with a conductor. The wiring layer 2 extends below the MIM capacitive element 20b. The upper electrode 7b, the lower electrode 5b, and the wiring layer 2 are formed at different depths in the semiconductor device 50c. The via wiring 12a and the via hole 11a, the via wiring 12b and the via hole 11b, and the via wiring 12c and the via hole 11c are respectively collectively referred to as a contact via.

A method of manufacturing the semiconductor device 50c of the third embodiment is described below with reference to FIGS. 7A-7D and FIGS. 8A-8D.

Figure 7A:
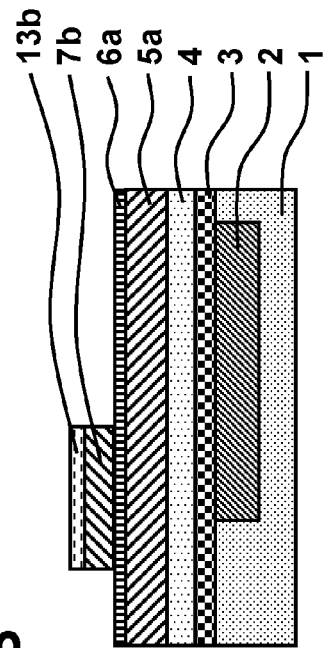
FIGS. 7A-7D are cross-sectional views each illustrating a method of manufacturing a semiconductor device 50c according to a third embodiment.

Referring to FIG. 7A, the diffusion preventing layer 3, the silicon dioxide layer 4, the first conductive layer 5a, the dielectric layer 6a, the second conductive layer 7a, and a second etching stopper 13a are laminated in that order over the wiring layer 2 in the lower interlayer insulator 1. The diffusion preventing layer 3 is made of silicon carbide and has a thickness of, for example, about 70 nm. The silicon dioxide layer 4 has a thickness of, for example, about 100 nm. The first conductive layer 5a is made of titanium nitride and has a thickness of, for example, about 150 nm. The dielectric layer 6a is made of silicon nitride and has a thickness of, for example, about 40 nm. The second conductive layer 7a is made of titanium nitride and has a thickness of, for example, about 100 nm. The second etching stopper 13a is made of silicon carbide and has a thickness of, for example, about 31 nm.

Figure 7B:
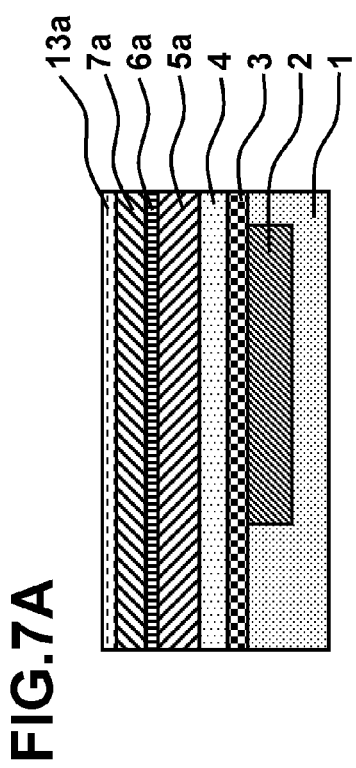

Referring to FIG. 7B, the second etching stopper 13a and the second conductive layer 7a are patterned through a lithographic process and an etching process to form the second etching stopper 13b and the upper electrode 7b. In this process, the first conductive layer 5a and the dielectric layer 6a are formed to extend over the second etching stopper 13b and the upper electrode 7b.

Figure 7C:
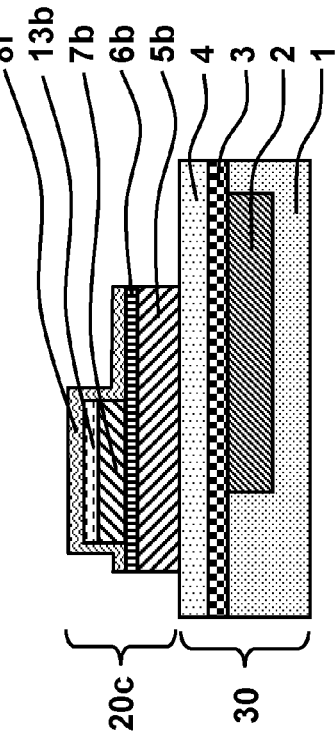

Referring to FIG. 7C, a first etching stopper 8e made of silicon carbide is deposited to a thickness of, for example, about 47 nm through a CVD process, thereby covering the second etching stopper 13b, the upper electrode 7b and the dielectric layer 6a.

Figure 7D:
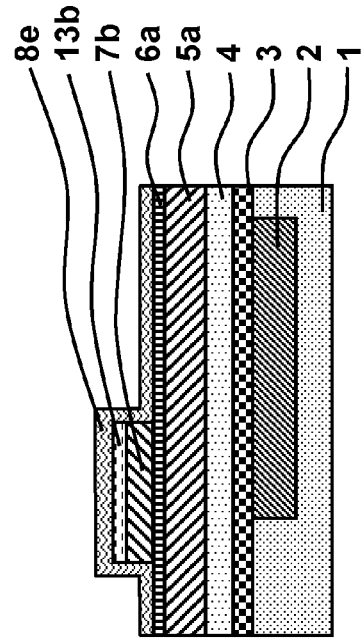

With reference to FIG. 7D, the first etching stopper 8e, the second etching stopper 13b, the dielectric layer 6a, and the first conductive layer 5a are treated by a lithographic process and an etching process. Through this process, the first etching stopper 8f, the second etching stopper 13b, the dielectric layer 6b, and the lower electrode 5b are formed. The MIM capacitive element 20c, including the upper electrode 7b, the dielectric layer 6b, and the lower electrode 5b, is thus formed.

With reference to FIG. 8A, a $SiO_2$ layer is formed to a thickness of, for example, about 650 nm as the interlayer insulator 9 using a silane gas to cover the silicon dioxide layer 4, the lower electrode 5b, the dielectric layer 6b, and the first etching stopper 8f.

Referring to FIG. 8B, the via hole 10a, the via hole 10b, and the via hole 10c are opened in the interlayer insulator 9 and the silicon dioxide layer 4 respectively toward the upper electrode 7b, the lower electrode 5b, and the wiring layer 2 at the same operation through a lithography process and an etching process in the same manner as described with reference to FIG. 2B. The interlayer insulator 9 and the silicon dioxide layer 4 are etched using, for example, a mixture of a $C_4F_6$ gas, an Ar gas and an $O_2$ gas in the opening operation of the via hole 10a, the via hole 10b, and the via hole 10c.

Gas flow rates and pressure conditions are adjusted so that the interlayer insulator 9 has an etching rate higher than that of each of the first etching stopper 8f, the dielectric layer 6b, and the diffusion preventing layer 3. More specifically, gas flow rates and pressure conditions are adjusted so that each of the first etching stopper 8f, the dielectric layer 6b, and the diffusion preventing layer 3 may have an etching rate equal to or lower than 0.1 times the etching rate of the interlayer insulator 9, under the same etching condition as the etching condition applied to the interlayer insulator 9. Such an adjustment prevents the upper electrode 7b and the lower electrode 5b from being overetched.

In the etching process, the etching rate of the silicon dioxide layer may be preferably about 65 times the etching rate of the silicon carbide layer. Subsequent to the opening of via holes, the first etching stopper 8f remaining in each of the via hole 10a, the via hole 10b, and the via hole 10c is about 70 nm thick on the upper electrode 7b and about 25 nm thick on the lower electrode 5b. In addition to the first etching stopper 8f, the dielectric layer 6b made of silicon nitride and having a thickness of about 40 nm is present on the lower electrode 5b.

Referring to FIG. 8C, the first etching stopper 8f, the dielectric layer 6b, and the diffusion preventing layer 3 respectively present at the bottoms of the via hole 10a, the via hole 10b, and the via hole 10c are removed. These layers are etched using, for example, $CH_2F_2/N_2/O_2$ gases containing a fluorine based $CH_2F_2$ gas through the RIE process. In this etching process, the chamber temperature is, for example, room temperature, and gas flow rates are, for example, 10-35 sccm for the $CH_2F_2$ gas, 50-100 sccm for the $N_2$ gas, and 15-40 sccm for the $O_2$ gas. The via hole 11a, the via hole 11b, and the via hole 11c are thus opened.

If the silicon carbide layer and the silicon nitride layer are etched at the same operation using a mixture of the $CH_2F_2$ gas, the $O_2$ gas, and the $N_2$ gas, the etching rate of the silicon carbide may become about 1.13 times the etching rate of the silicon nitride. The amounts of etch under the etching condition are 40 nm for the silicon nitride layer and 45 nm for the silicon carbide layer. The first etching stopper 8f and the second etching stopper 13b on the upper electrode 7b, the first etching stopper 8f and the dielectric layer 6b on the lower electrode 5b, and the diffusion preventing layer 3 on the wiring layer 2 are removed at the same operation of removing each etching stopper remaining at the bottom of each via. The upper electrode 7b, the lower electrode 5b, and the wiring layer 2 are prevented from being overetched. A good contact is established when each via is filled with the metal.

Referring to FIG. 8D, for example, tungsten (W) is placed to fill the via hole 11a, the via hole 11b, and the via hole 11c through a CVD process to form the via wiring 12a, the via wiring 12b, and the via wiring 12c. A barrier metal formation operation is not illustrated. The semiconductor device 50c including the MIM capacitive element 20c is thus produced.

The second etching stopper 13b is formed on the upper electrode 7b in the semiconductor device 50c of the third embodiment. With this structure, the second etching stopper 13b formed on the upper electrode 7b, the first etching stopper 8f formed on the lower electrode 5b, and the diffusion preventing layer 3 formed on the wiring layer 2 are removed in the removal process of the etching stopper remaining in each of the via hole 10a, the via hole 10b, and the via hole 10c. The upper electrode 7b, the lower electrode 5b, and the wiring layer 2 may be prevented from being overetched. A good contact may be established in the filling of the via hole 11a, the via hole 11b, and the via hole 11c with the metal.

A fourth embodiment is described below with reference to FIGS. 9A-9C through FIGS. 11A-11C. FIGS. 9A-9C through FIGS. 11A-11C illustrates in detail a structure and a manufacturing method of a semiconductor device 50d having an MIM capacitive element 20d in accordance with the fourth embodiment. Elements identical to those described in connection with the first through third embodiments are designated with the same reference numerals and the discussions thereof are omitted here.

As the semiconductor device 50b of the second embodiment, the semiconductor device 50d of the fourth embodiment includes the first etching stopper 8h and the dielectric layer 6d, both made of silicon nitride (SiN). With this structure, a groove defect generated in a dielectric layer 6d present beneath the upper electrode 7b in the course of a patterning process of the upper electrode 7b is filled with the first etching stopper 8h that is made of the same material as the dielectric layer 6d. More specifically, the defect of the dielectric layer 6d is corrected. This arrangement thus controls a reduction in withstanding voltage of the MIM capacitive element 20d and lot-to-lot manufacturing variations in the capacitance of the MIM capacitive element 20d.

A structure of the semiconductor device 50d of the fourth embodiment is described below with reference to FIG. 11C.

The semiconductor device 50d includes the MIM capacitive element 20d on the substrate 30. The interlayer insulator 9 is formed, covering the substrate 30 and the MIM capacitive element 20d.

The MIM capacitive element 20d includes the upper electrode 7b, the dielectric layer 6c, and the lower electrode 5b. The lower electrode 5b and the dielectric layer 6d are formed to extend over the upper electrode 7b. The first etching stopper 8h is formed, covering the upper electrode 7b and the dielectric layer 6d. The second etching stopper 13b is formed on the upper electrode 7b.

The via hole 11a is opened in the interlayer insulator 9 and the first etching stopper 8h to establish electrical connection with the upper electrode 7b of the MIM capacitive element 20d. The via hole 11b is opened in the interlayer insulator 9, the first etching stopper 8h, and the dielectric layer 6b to establish electrical connection with the lower electrode 5b of the MIM capacitive element 20d. The via hole 11c is opened in the interlayer insulator 9, the silicon dioxide layer 4, and the diffusion preventing layer 3 to establish electrical connection with the wiring layer 2 of the substrate 30. The via wiring 12a is formed by filling the via hole 11a with a conductor. The via wiring 12b is formed by filling the via hole 11b with a conductor. The via wiring 12c is formed by filling the via hole 11c with a conductor. The wiring layer 2 extends below the MIM capacitive element 20d. The upper electrode 7b, the lower electrode 5b, and the wiring layer 2 are formed at different depths of the semiconductor device 50d. The via wiring 12a and the via hole 11a, the via wiring 12b and the via hole 11b, and the via wiring 12c and the via hole 11c are respectively collectively referred to as a contact via.

A method of manufacturing the semiconductor device 50d of the fourth embodiment is described below with reference to FIGS. 9A-9C through FIGS. 11A-11C.

Figure 9A:
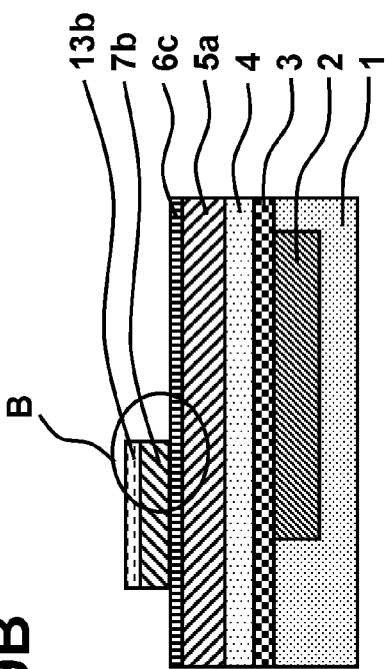
FIGS. 9A-9C are cross-sectional views each illustrating a method of manufacturing a semiconductor device 50d according to the fourth embodiment.

Referring to FIG. 9A, the diffusion preventing layer 3, the silicon dioxide layer 4, the first conductive layer 5a, the dielectric layer 6c, the second conductive layer 7a, and a second etching stopper 13a are laminated in that order over the wiring layer 2 in the lower interlayer insulator 1. The diffusion preventing layer 3 is made of silicon carbide and has a thickness of, for example, about 70 nm. The silicon dioxide layer 4 has a thickness of, for example, about 100 nm. The first conductive layer 5a is made of titanium nitride (TiN) and has a thickness of, for example, about 150 nm. The dielectric layer 6c is made of silicon nitride and has a thickness of, for example, about 40 nm. The second conductive layer 7a is made of titanium nitride and has a thickness of, for example, about 100 nm. The second etching stopper 13a is made of silicon nitride and has a thickness of, for example, about 48 nm. The dielectric layer 6c and the second etching stopper 13a are made of the same material, namely, silicon nitride.

Figure 9B:
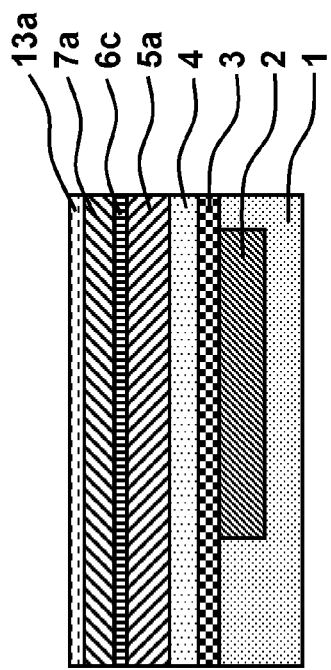

Referring to FIG. 9B, the second conductive layer 7a and the second etching stopper 13a are patterned through a lithographic process and an etching process to form the upper electrode 7b and the second etching stopper 13b. In this process, the first conductive layer 5a and the dielectric layer 6c are formed to extend over the second etching stopper 13b and the upper electrode 7b.

Figure 9C:
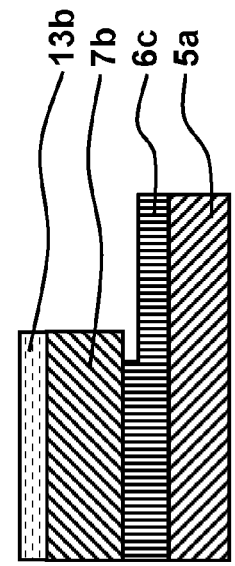

FIG. 9C is an expanded view of a contact portion denoted by the letter B between the underside of the upper electrode 7b and the dielectric layer 6c in FIG. 9B. FIG. 9C illustrates a groove defect that is generated in the dielectric layer 6c present beneath the upper electrode 7b in the course of the patterning process of the second conductive layer 7a. Such a groove defect causes a reduction in the withstanding voltage of the MIM capacitive element 20d and lot-to-lot variations in the capacitance of the MIM capacitive element 20d.

Figure 10A:
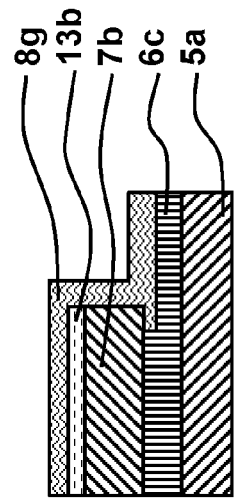
FIGS. 10A-10D are cross-sectional views each illustrating the method of manufacturing the semiconductor device 50d according to the fourth embodiment.
Figure 10B:
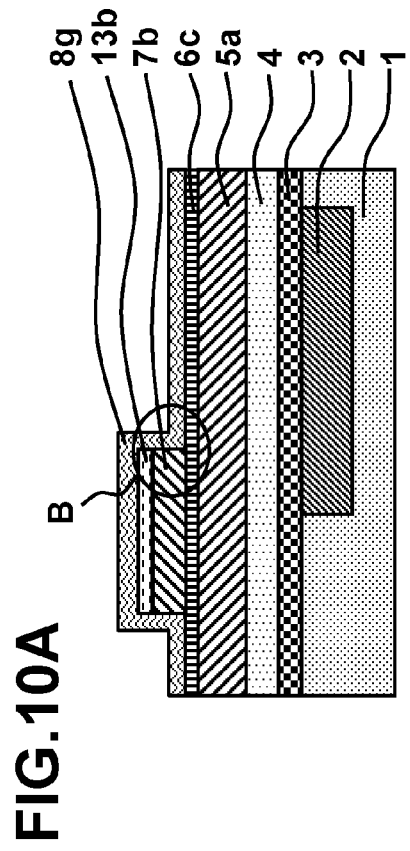

With reference to FIG. 10A, a first etching stopper 8g made of silicon nitride is formed to a thickness of, for example, about 43 nm to cover the upper electrode 7b and the dielectric layer 6c through a CVD process. FIG. 10B is an expanded view of a contact portion denoted by the letter B between the underside of the upper electrode 7b and the dielectric layer 6c in FIG. 10A. As illustrated in FIG. 10B, the first etching stopper 8g made of the same material of the dielectric layer 6c may fill a groove defect that has been generated in the dielectric layer 6c generated beneath the upper electrode 7b in the course of the patterning process of the upper electrode 7b. The defect of the dielectric layer 6c is thus corrected. This arrangement controls a reduction in the withstanding voltage of the MIM capacitive element 20d and lot-to-lot variations in the capacitance of the MIM capacitive element 20d.

Figure 10C:
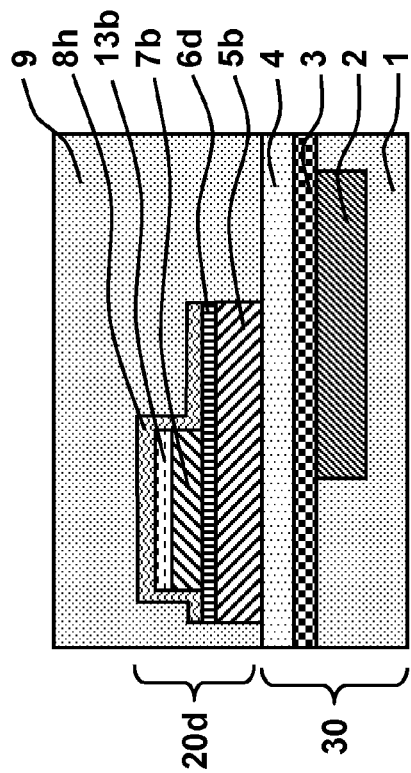

With reference to FIG. 10C, the first etching stopper 8g, the dielectric layer 6c, and the first conductive layer 5a are treated by a lithographic process and an etching process. Through this process, the first etching stopper 8h, the dielectric layer 6d, and the lower electrode 5b are formed. The MIM capacitive element 20d, including the upper electrode 7b, the dielectric layer 6d, and the lower electrode 5b, thus results.

Figure 10D:
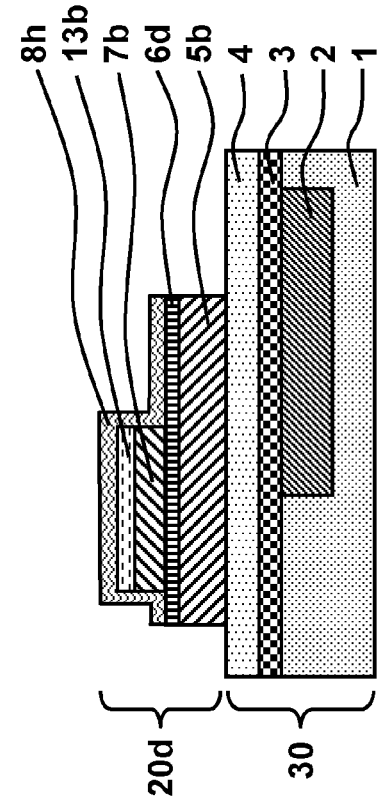

With reference to FIG. 10D, a plasma $SiO_2$ layer is formed to a thickness of, for example, about 650 nm as the interlayer insulator 9 using a silane gas to cover the silicon dioxide layer 4, the lower electrode 5b, the dielectric layer 6d, and the first etching stopper 8h.

Figure 11B:
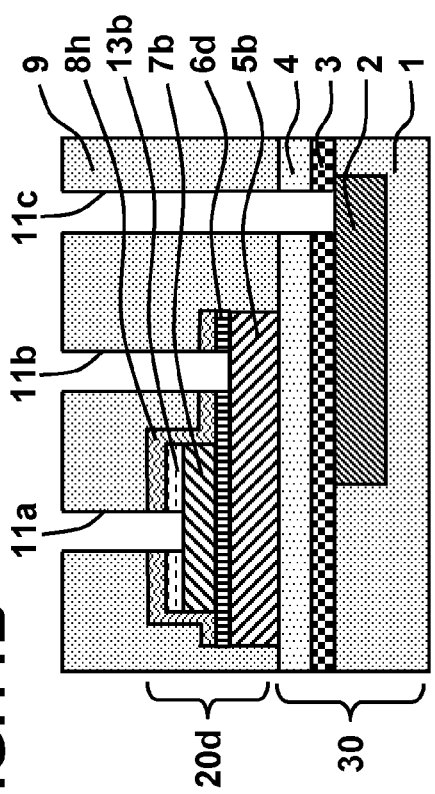
FIGS. 11A-11C are cross-sectional views each illustrating the method of manufacturing the semiconductor device 50d according to the fourth embodiment.
Figure 11A:
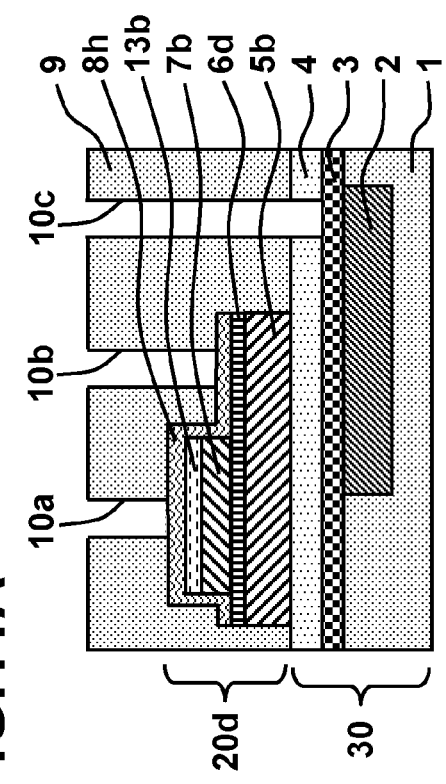

Referring to FIG. 11A, the via hole 10a, the via hole 10b, and the via hole 10c are opened in the interlayer insulator 9 and the silicon dioxide layer 4 toward the upper electrode 7b, the lower electrode 5b, and the wiring layer 2, respectively, at the same operation through a lithographic process and an etching process in the same manner as described with reference to FIG. 8B. The interlayer insulator 9 and the silicon dioxide layer 4 are etched using, for example, a mixture of a $C_4F_6$ gas, an Ar gas and an $O_2$ gas in the opening operation of the via hole 10a, the via hole 10b, and the via hole 10c.

Gas flow rates and pressure conditions adjusted so that the interlayer insulator 9 has an etching rate higher than that of each of the first etching stopper 8b, the second etching stopper 13b, the dielectric layer 6d, and the diffusion preventing layer 3. More specifically, gas flow rates and pressure conditions are adjusted so that each of the second etching stopper 13b, the first etching stopper 8b, the dielectric layer 6d, and the diffusion preventing layer 3 may have an etching rate equal to or lower than 0.1 times the etching rate of the interlayer insulator 9, under the same etching condition as the etching condition applied to the interlayer insulator 9. Such an adjustment prevents the upper electrode 7b and the lower electrode 5b from being overetched.

In the etching process, the etching rate of the silicon dioxide layer may be preferably about 19 times the etching rate of the silicon carbide layer. Subsequent to the etching process, a silicon nitride layer having a thickness of, for example, about 62 nm is present on the upper electrode 7b and the lower electrode 5b at each via bottom.

Referring to FIG. 11B, the first etching stopper 8h, the second etching stopper 13b, the dielectric layer 6d, and the diffusion preventing layer 3 respectively present at the bottoms of the via hole 10a, the via hole 10b, and the via hole 10c are removed. These layers are etched using, for example, $CH_2F_2/N_2/O_2$ gases containing a fluorine based $CH_2F_2$ gas through the RIE process. In this etching process, the chamber temperature is, for example, room temperature, and gas flow rates are, for example, 10-35 sccm for the $CH_2F_2$ gas, 50-100 sccm for the $N_2$ gas, and 15-40 sccm for the $O_2$ gas. The via hole 11a, the via hole 11b, and the via hole 11c are thus opened.

If the silicon carbide layer and the silicon nitride layer are etched at the same operation using, for example, a mixture of the $CH_2F_2$ gas, the $O_2$ gas, and the $N_2$ gas, the etching rate of the silicon carbide may become about 1.13 times the etching rate of the silicon nitride. The etching stopper remaining on the upper electrode 7b and the etching stopper remaining on the lower electrode 5b at the via hole are silicon carbide layers having a thickness of, for example, about 70 nm under this condition. The first etching stopper 8h and the second etching stopper 13b on the upper electrode 7b, the first etching stopper 8h and the dielectric layer 6d on the lower electrode 5b, and the diffusion preventing layer 3 on the wiring layer 2 are removed at the same operation as the operation of removing each etching stopper remaining at the bottom of each via hole. The upper electrode 7b, the lower electrode 5b, and the wiring layer 2 may be prevented from being overetched. A good contact is established when each via hole is filled with the metal.

Figure 11C:
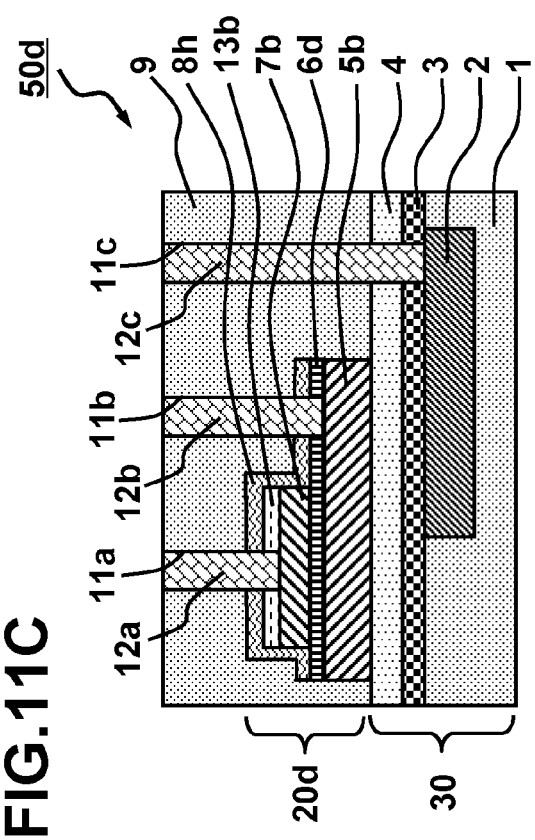

Referring to FIG. 11C, for example, tungsten (W) is placed to fill the via hole 11a, the via hole 11b, and the via hole 11c through a CVD process to form the via wiring 12a, the via wiring 12b, and the via wiring 12c in the same manner as previously described with reference to FIG. 2D. A barrier metal formation operation is not illustrated. The semiconductor device 50d including the MIM capacitive element 20d is thus produced.

In accordance with the semiconductor device 50d of the fourth embodiment, the second etching stopper 13b is formed on the upper electrode 7b. With this structure, the second etching stopper 13b formed on the upper electrode 7b, the first etching stopper 8h formed on the lower electrode 5b, and the diffusion preventing layer 3 formed on the wiring layer 2 are removed at the same operation as the operation of removing the etching stopper remaining at the bottom of each via hole. The upper electrode 7b, the lower electrode 5b, and the wiring layer 2 may be prevented from being overetched. A good contact may thus be established when each via hole is filled with the metal.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments have been described in detail, it should be understood that the various changes, substitutions, and alterations could be made hereto without departing from the spirit and scope of the invention.

What is claimed is:

1. A method of manufacturing a semiconductor device, comprising:
    forming a wiring layer in a first insulating layer;
    forming a second insulating layer over the first insulating layer;
    forming a first conductive layer over the second insulating layer;
    forming a dielectric layer on the first conductive layer;
    forming a second conductive layer on the dielectric layer;
    selectively removing the second conductive layer to form an upper electrode on the dielectric layer;
    forming a first layer over the upper electrode and the dielectric layer;
    selectively removing the first layer, the dielectric layer, and the first conductive layer to form a lower electrode over which the dielectric layer and the first layer is entirely left, the upper electrode remaining partially over the lower electrode;
    forming a third insulating layer over the second insulating layer and the first layer, the third insulating layer having the etching resistance property smaller than the etching resistance property of the second insulating layer and the first layer against an etchant for etching the third insulating layer;
    selectively removing the third insulating layer to form a first aperture exposing the second insulating layer above the wiring layer, a second aperture exposing the first layer above the upper electrode, and a third aperture exposing the first layer above the dielectric layer; and
    performing an etching operation to expose the wiring layer below the first aperture, the upper electrode below the second aperture, and the lower electrode below the third aperture.

2. The method according to claim 1, wherein each of the second insulating layer, the first layer, and the dielectric layer includes an insulating layer having an etching rate equal to or smaller than 0.1 times the etching rate of the third insulating layer against the etchant for etching the third insulating layer.

3. The method according to claim 2, further comprising forming a second layer on the second conductive layer after the forming the second conductive layer on the dielectric layer; and
    selectively removing the second layer while the second conductive layer is selectively removed to form the upper electrode on the dielectric layer.

4. The method according to claim 3, further comprising forming the first layer on a side surface of the upper electrode and on a side surface of the second layer.

5. The method according to claim 4, wherein the dielectric layer, the first layer and the second layer include the same material.

* * * * *